United States Patent
Tamura et al.

(10) Patent No.: US 7,592,579 B2
(45) Date of Patent: Sep. 22, 2009

(54) PHOTOELECTRIC CONVERSION DEVICE MANUFACTURING METHOD, SEMICONDUCTOR DEVICE MANUFACTURING METHOD, PHOTOELECTRIC CONVERSION DEVICE, AND IMAGE SENSING SYSTEM

(75) Inventors: Seiichi Tamura, Yokohama (JP); Tetsuya Itano, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/341,385

(22) Filed: Dec. 22, 2008

(65) Prior Publication Data
US 2009/0166516 A1 Jul. 2, 2009

(30) Foreign Application Priority Data
Dec. 28, 2007 (JP) .............................. 2007-341113

(51) Int. Cl.
*H01L 27/00* (2006.01)
(52) U.S. Cl. .............................. 250/208.1; 250/214 R; 250/214.1; 257/292
(58) Field of Classification Search .............. 250/208.1, 250/214 R, 214.1; 257/290–294, 234, 437; 438/48; 348/308, 294, 340
See application file for complete search history.

(56) References Cited

U.S. PATENT DOCUMENTS

| 6,344,670 | B2 * | 2/2002 | Yamaguchi et al. ......... 257/292 |
| 6,614,479 | B1 * | 9/2003 | Fukusho et al. ............. 348/308 |
| 6,635,912 | B2 * | 10/2003 | Ohkubo ....................... 257/292 |
| 7,126,102 | B2 | 10/2006 | Inoue et al. ............. 250/214 R |
| 7,205,523 | B2 | 4/2007 | Mishima et al. .......... 250/208.1 |
| 7,321,110 | B2 | 1/2008 | Okita et al. ............... 250/208.1 |
| 7,365,380 | B2 | 4/2008 | Yuzurihara et al. .......... 257/292 |
| 7,408,210 | B2 | 8/2008 | Ogura et al. ................. 257/233 |
| 7,460,162 | B2 | 12/2008 | Koizumi et al. ............. 348/294 |
| 7,462,810 | B2 | 12/2008 | Kobayashi et al. ....... 250/208.1 |
| 7,531,860 | B2 * | 5/2009 | Kim ........................... 257/292 |
| 2006/0163618 | A1 | 7/2006 | Park ........................... 257/221 |
| 2006/0208292 | A1 | 9/2006 | Itano et al. .................. 257/292 |
| 2008/0029793 | A1 | 2/2008 | Watanabe et al. ........... 257/291 |
| 2008/0030612 | A1 | 2/2008 | Itano et al. .................. 348/340 |
| 2008/0036891 | A1 | 2/2008 | Ono et al. ................... 348/308 |
| 2008/0158403 | A1 | 7/2008 | Itano et al. .................. 348/308 |
| 2009/0015699 | A1 | 1/2009 | Watanabe et al. ........... 340/308 |

FOREIGN PATENT DOCUMENTS

| JP | 2001-053260 A | 2/2001 |
| JP | 2006-210919 A | 8/2006 |
| JP | 2006/310650 A | 11/2006 |
| JP | 2006-310650 A | 11/2006 |

* cited by examiner

*Primary Examiner*—Seung C Sohn
(74) *Attorney, Agent, or Firm*—Fitzpatrick, Cella, Harper & Scinto

(57) ABSTRACT

A photoelectric conversion device manufacturing method comprises: a first implantation step of implanting impurity ions of a first conductivity type into an underlying substrate via a region of the oxide film exposed by an opening, thereby forming a first semiconductor region having a first thickness in the element region; an the oxidation step of oxidizing the region of the oxide film exposed by the opening, thereby thickening the exposed region; an the exposure step of exposing a region of the oxide film which is not exposed by the opening; a the second implantation step of, after the exposure step, implanting the impurity ions of the first conductivity type into the underlying substrate via a region unthickened in the oxidation step, thereby forming a second semiconductor region having a second thickness larger than the first thickness in the element isolation region; and an the element formation step.

8 Claims, 12 Drawing Sheets

PHOTOELECTRIC CONVERSION DEVICE MANUFACTURING METHOD, SEMICONDUCTOR DEVICE MANUFACTURING METHOD, PHOTOELECTRIC CONVERSION DEVICE, AND IMAGE SENSING SYSTEM

BACKGROUND OF THE INVENTION

1. Field of the Invention

The present invention relates to a photoelectric conversion device manufacturing method, semiconductor device manufacturing method, photoelectric conversion device, and image sensing system.

2. Description of the Related Art

A photoelectric conversion device is recently used in a two-dimensional image input apparatus represented by a digital still camera and a video camcorder or a one-dimensional image reading apparatus represented by a facsimile apparatus and a scanner. The demand for photoelectric conversion devices is rapidly growing.

A photoelectric conversion device uses, for example, a CCD (Charge Coupled Device) or a MOS sensor. CMOS sensors have been in practical use as a typical MOS sensor.

A CMOS sensor includes a pixel array and a control portion.

In the pixel array, a plurality of pixels are arrayed in the row and column directions. Each pixel has a circuit arrangement shown in FIG. 11. FIG. 11 is a circuit diagram of a pixel of a conventional CMOS sensor.

Referring to FIG. 11, a photodiode (to be referred to as a "PD" hereinafter) 1001 converts light into a signal (charges) and accumulates it. A transfer MOS transistor 1002 transfers the signal (charges) accumulated in the PD 1001. Reference numeral 1003 denotes a floating diffusion (to be referred to as an "FD" hereinafter) 1003. A reset signal to reset the FD 1003 and the PD 1001 is supplied to the gate of a reset MOS transistor 1004. A selection signal to select an arbitrary row of the pixel array is supplied from the control portion to the gate of a selection MOS transistor 1005. An amplification MOS transistor 1006 performs a source follower operation together with a constant current source 1008, thereby amplifying a signal received from the FD 1003 and outputting it to a column signal line 1007.

The control portion controls each of the plurality of pixels in the pixel array. The control portion includes at least one of a circuit for processing signals from the pixels, and a driving circuit (shift register) for driving transistors in the pixels, although neither are shown. The control portion is formed as a peripheral circuit in the same substrate as the pixel array.

To implement the circuit arrangement shown in FIG. 11, a technique disclosed in Japanese Patent Laid-Open No. 2006-310650 forms each pixel having a sectional structure shown in FIG. 12. FIG. 12 is a sectional view of a pixel of a conventional CMOS sensor.

As shown in FIG. 12, the PD 1001 includes a charge accumulation layer 1001a and a protection layer 1001b. The charge accumulation layer 1001a is an n-type semiconductor region to accumulate a signal (charges or electrons) generated in accordance with light 1109 that has entered the PD 1001. The protection layer 1001b is a p$^+$-type semiconductor region to protect the surface of the charge accumulation layer 1001a. "P$^+$-type" indicates that the concentration of a p-type impurity is higher than in a "p-type" region.

An element isolation portion 1102 is formed from an insulating film to electrically isolate the charge accumulation layers 1001a of the plurality of PDs 1001 from each other. A channel stop region 1106 that is a p$^+$-type semiconductor region is formed under the element isolation portion 1102. Additionally, a well region 1107 that is a p$^-$-type semiconductor region is formed around the channel stop region 1106 and the charge accumulation layer 1001a. "P$^-$-type" indicates that the concentration of a p-type impurity is lower than in a "p-type" region.

According to Japanese Patent Laid-Open No. 2006-310650, this structure can effectively prevent charge leakage to neighboring pixels.

FIG. 12 illustrates the FD 1003, and a gate 1002a of the transfer MOS transistor 1002.

A recent photoelectric conversion device is required to have more pixels in a predetermined chip area. It is therefore necessary to reduce the area occupied by a unit pixel.

When the size of a pixel having the sectional structure shown in FIG. 12 decreases, the space between the adjacent PDs (photoelectric conversion units) 1001 can also become narrow.

In this case, a signal accumulated in the charge accumulation layer 1001a of the PD 1001 may leak to the charge accumulation layer 1001a of an adjacent PD 1001 via the well region 1107. The well region 1107 is a p$^-$-type semiconductor region and cannot therefore form a sufficient potential barrier against the adjacent charge accumulation layer 1001a. This may lead to a decrease in the sensitivity of the PD 1001.

Additionally, if the charge accumulation layer 1001a of the PD 1001 capacitively couples with the charge accumulation layer 1001a of an adjacent pixel via the well region 1107, the PD 1001 may suffer crosstalk from the charge accumulation layer 1001a of the adjacent pixel.

In a method of manufacturing a general semiconductor device including a photoelectric conversion device, it is difficult to accurately form semiconductor regions having different thicknesses in a predetermined region of a semiconductor substrate.

More specifically, in an ion implantation apparatus for forming a semiconductor region in a predetermined region of a semiconductor substrate, the impurity ion acceleration energy may be restricted by the structure of the ion accelerator. The ion accelerator of an ion implantation apparatus normally accelerates an ionized impurity using a plurality of magnetic field accelerators. Energy the ion implantation apparatus can accelerate in a distance of several meters is only about 1 to 2 MeV, considering the realistic floor area of the apparatus. The ionization efficiency of multi-charged ions decreases exponentially relative to the distance in the traveling direction. For this reason, the number of ions finally reaching near the wafer, that is, the dose further decreases. It is therefore difficult to implant impurity ions to a predetermined depth or more in the semiconductor substrate.

When the ion implantation apparatus increases the acceleration energy, the variation in the impurity concentration in a direction perpendicular to the implantation direction, that is, so-called lateral standard deviation in the semiconductor substrate containing the implanted impurity ions may increase. This may degrade the accuracy in the lateral direction when forming impurity regions having different concentrations in the semiconductor substrate.

Ion implantation into a silicon substrate breaks the single-crystal structure of silicon. For this reason, annealing after implantation for crystal defect recovery and impurity relocation between the lattices are indispensable. In particular, crystal defects in the latter process have a particularly large influence on a photoelectric conversion device. The ion implantation forms, at a high probability, base defects in the semiconductor substrate, for example, a heavy metal that readily forms a deep level. This may cause white defects fatal in an image obtained by the photoelectric conversion device. That is, as the implantation energy rises, the ion implantation amount increases, and the number of times of implantation increases, a higher annealing temperature and a longer process time for defect recovery need be set. This may make it difficult to design a desired profile and result in residual defects.

SUMMARY OF THE INVENTION

It is the first aim of the present invention to improve the sensitivity of photoelectric conversion units and suppress crosstalk between adjacent photoelectric conversion units even when the interval between them is smaller.

It is the second aim of the present invention to raise the accuracy in forming semiconductor regions having different thicknesses at a predetermined depth or more in a semiconductor substrate.

According to the first aspect of the present invention, there is provided a photoelectric conversion device manufacturing method comprising: an the oxide film formation step of forming an oxide film on a surface of an underlying substrate including an element region and an element isolation region; a the mask formation step of forming, on the oxide film, a mask having an opening in the element region; a the first implantation step of implanting impurity ions of a first conductivity type into the underlying substrate via a region of the oxide film exposed by the opening, thereby forming a first semiconductor region having a first thickness in the underlying substrate under the oxide film in the element region; an the oxidation step of oxidizing the region of the oxide film exposed by the opening, thereby thickening the exposed region; an the exposure step of exposing a region of the oxide film which is not exposed by the opening; a the second implantation step of, after the exposure step, implanting the impurity ions of the first conductivity type into the underlying substrate via a region unthickened in the oxidation step, thereby forming a second semiconductor region having a second thickness larger than the first thickness in the underlying substrate under the oxide film in the element isolation region; and an the element formation step of, after the second implantation step, forming a photoelectric conversion unit above the first semiconductor region, the photoelectric conversion unit including a third semiconductor region of a second conductivity type opposite to the first conductivity type and accumulating a photoelectrically converted signal.

According to the second aspect of the present invention, there is provided a semiconductor device manufacturing method comprising: an oxide film formation step of forming an oxide film on a surface of an underlying substrate including a first region and a second region; a mask formation step of forming, on the oxide film, a mask having an opening in the first region; a first implantation step of implanting impurity ions into the underlying substrate via a region of the oxide film exposed by the opening, thereby forming a first semiconductor region having a first thickness in the underlying substrate under the oxide film in the first region; an oxidation step of oxidizing the region of the oxide film exposed by the opening, thereby thickening the exposed region; an exposure step of exposing a region of the oxide film which is not exposed by the opening; a second implantation step of, after the exposure step, implanting impurity ions into the underlying substrate via a region unthickened in the oxidation step, thereby forming a second semiconductor region having a second thickness larger than the first thickness in the underlying substrate under the oxide film in the second region; a removal step of, after the second implantation step, removing the oxide film including a portion thickened in the oxidation step; and a growing step of, after the removal step, growing a semiconductor layer on the underlying substrate, thereby forming a semiconductor substrate including the underlying substrate and the semiconductor layer.

According to the third aspect of the present invention, there is provided a photoelectric conversion device comprising a semiconductor substrate having an element region and an element isolation region, wherein the semiconductor substrate includes: a plurality of photoelectric conversion units, each of the plurality of the photoelectric conversion units being arranged in the element region and including a semiconductor region of a first conductivity type to accumulate a photoelectrically converted signal; a first semiconductor region of a second conductivity type opposite to the first conductivity type, the first semiconductor region having a first thickness and being arranged under the photoelectric conversion unit in the element region; an element isolation portion being arranged in the element isolation region to electrically isolate the plurality of the photoelectric conversion units; and a second semiconductor region of the second conductivity type, the second semiconductor region having a second thickness larger than the first thickness and being arranged under the element isolation portion in the element isolation region.

According to the fourth aspect of the present invention, there is provided an image sensing system comprising the above-described photoelectric conversion device, an optical system which forms an image on an imaging plane of the photoelectric conversion device, and a signal processing unit which processes a signal output from the photoelectric conversion device to generate image data.

According to the present invention, it is possible to improve the sensitivity of photoelectric conversion units and suppress crosstalk between adjacent photoelectric conversion units even when the interval between them is smaller.

According to the present invention, it is also possible to raise the accuracy in forming semiconductor regions having different thicknesses at a predetermined depth or more in a semiconductor substrate.

Further features of the present invention will become apparent from the following description of exemplary embodiments with reference to the attached drawings.

DESCRIPTION OF THE EMBODIMENTS

The embodiments of the present invention will now be described with reference to the accompanying drawings. Each embodiment of the present invention will be explained in association with a photoelectric conversion device. However, the embodiments are also applicable to any other semiconductor devices. The other semiconductor devices include a memory device such as a DRAM and a logic device such as a microcomputer.

Figure 1:
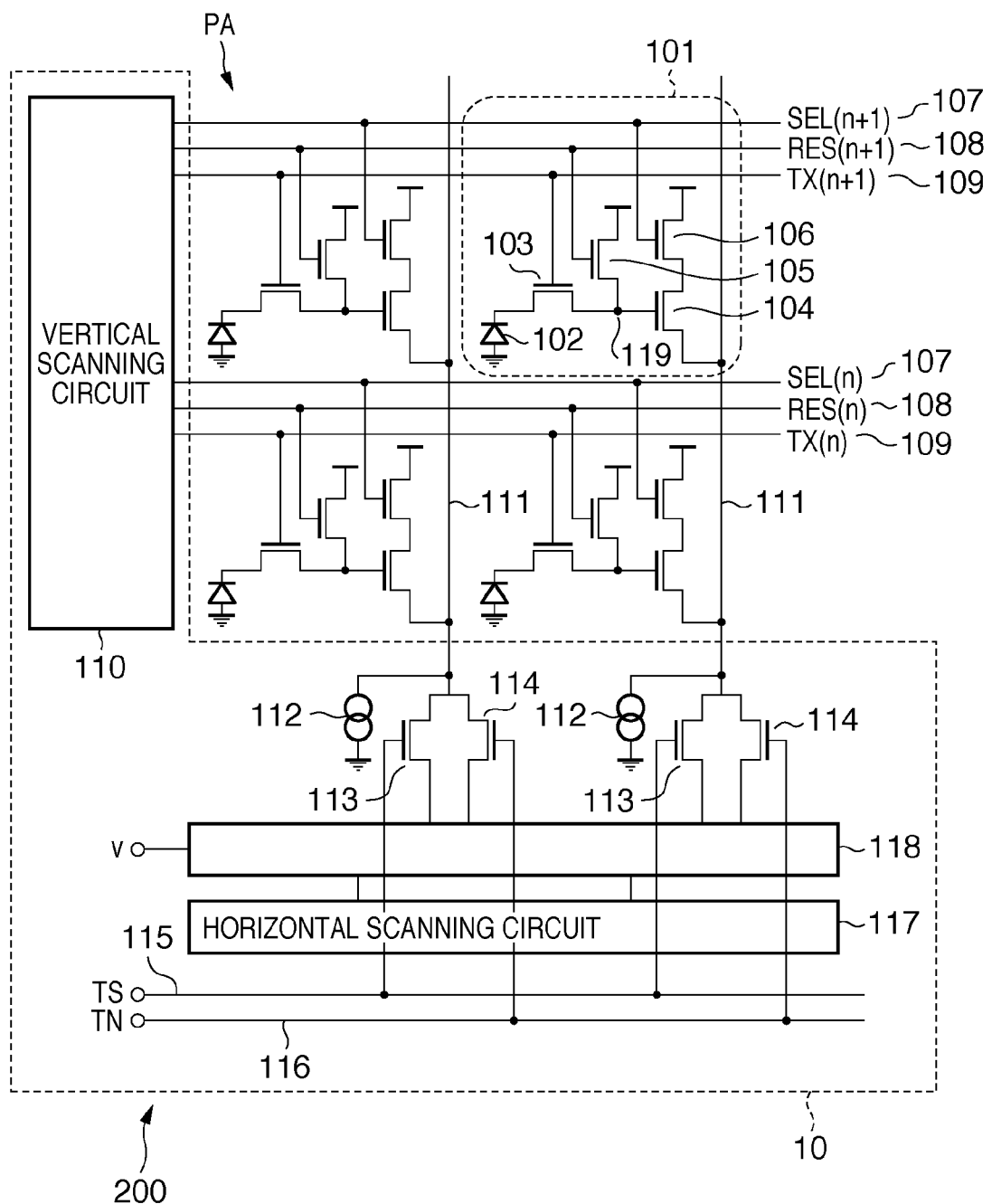
FIG. 1 is a block diagram of a photoelectric conversion device 200 according to the first embodiment of the present invention.

A photoelectric conversion device 200 according to the first embodiment of the present invention will be described with reference to FIG. 1. FIG. 1 is a block diagram of the photoelectric conversion device 200 according to the first embodiment of the present invention.

The photoelectric conversion device 200 includes a pixel array PA and a control portion 10.

In the pixel array PA, a plurality of pixels 101 are arrayed in the row and column directions. FIG. 1 illustrates the plurality of pixels 101 arrayed in 2 rows×2 columns. Each pixel 101 includes a photoelectric conversion unit 102, transfer MOS transistor 103, amplification MOS transistor 104, FD (Floating Diffusion) 119, reset MOS transistor 105, and selection MOS transistor 106. The photoelectric conversion unit 102 is, for example, a photodiode.

The control portion 10 includes a vertical scanning circuit 110, MOS transistors 113 and 114, holding portion 118, and horizontal scanning circuit 117.

The selection MOS transistors 106 of the same row are turned on when their gates receive an active signal from the vertical scanning circuit 110 via a selection line 107. A pixel whose selection MOS transistor 106 is ON is selected by the vertical scanning circuit 110.

The reset MOS transistors 105 of the same row are turned on when their gates receive an active signal from the vertical scanning circuit 110 via a reset line 108. The reset MOS transistor 105 is turned on to reset the FD 119.

The transfer MOS transistors 103 of the same row are turned on when their gates receive an active signal from the vertical scanning circuit 110 via a transfer line 109. The transfer MOS transistor 103 is turned on to transfer a signal accumulated in the photoelectric conversion unit 102 to the FD 119. The FD 119 inputs the transferred signal to the gate of the amplification MOS transistor 104. The amplification MOS transistor 104 performs a source follower operation together with a current source 112, thereby amplifying the received signal (noise signal or optical signal) and outputting it to a column signal line 111.

The MOS transistors 113 and 114 transfer, to the holding portion 118, the optical signal and the noise signal output to the column signal line 111, respectively. The holding portion 118 holds the optical signal and the noise signal for a predetermined period. The horizontal scanning circuit 117 sequentially selects each column of the holding portion 118 and transfers the optical signal and the noise signal from each column to an optical signal output line 115 and a noise signal output line 116, respectively. A differential amplification circuit (not shown) calculates the difference between the optical signal and the noise signal transferred to the optical signal output line 115 and the noise signal output line 116 and outputs the calculation result.

Figure 2:
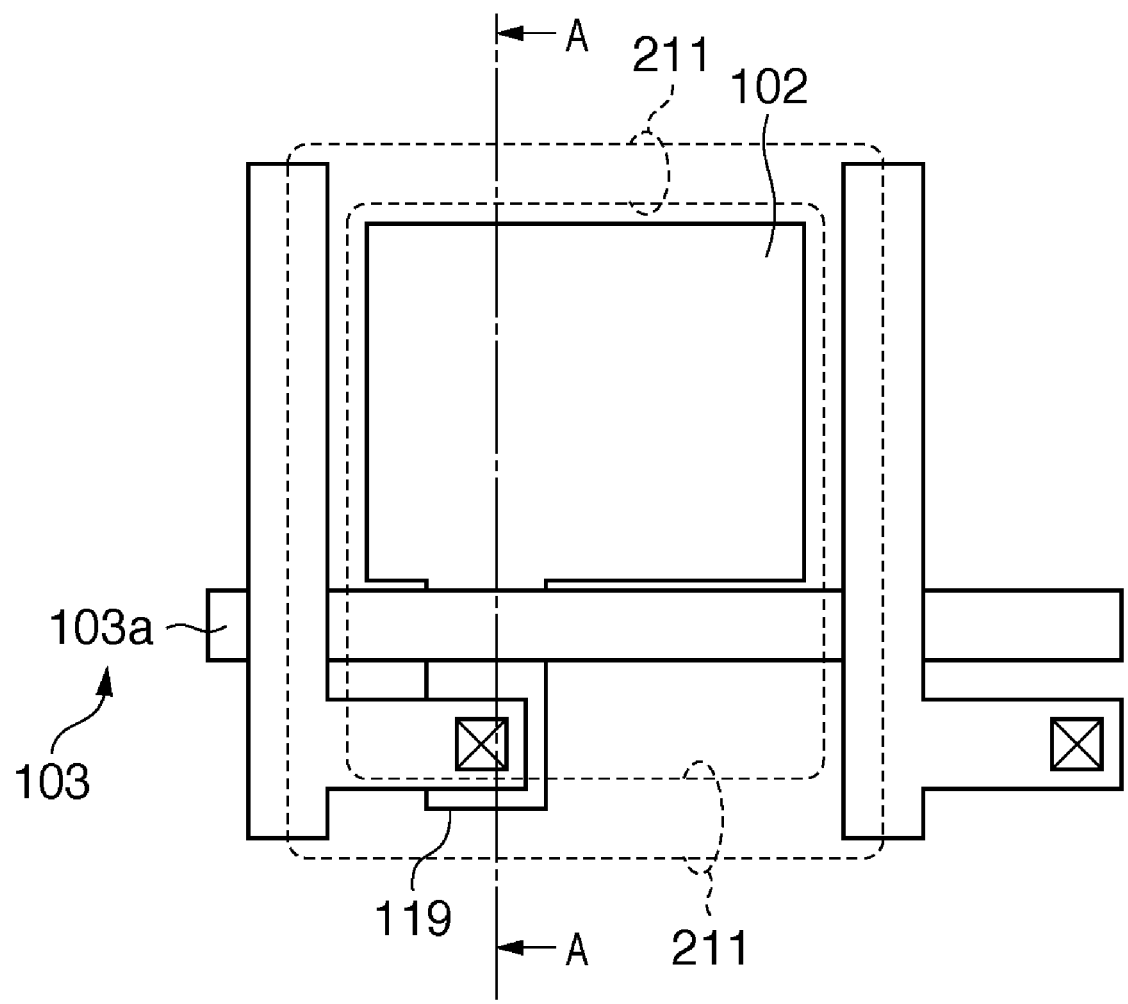
FIG. 2 is a plan view showing an example of the layout of the photoelectric conversion device 200.

The layout of the photoelectric conversion device 200 will be described next. FIG. 2 is a plan view showing an example of the layout of the pixel 101 of the photoelectric conversion device 200.

In a region indicated by broken lines surrounding the photoelectric conversion unit 102, a second semiconductor region 211 (to be described later) is arranged in a semiconductor substrate SB at a position deeper than the photoelectric conversion unit 102. The second semiconductor region 211 is a p$^+$-type semiconductor region. "P$^+$-type" indicates that the concentration of a p-type impurity is higher than in a "p-type" region. This raises the potential barrier between adjacent photoelectric conversion units 102. The second semiconductor region 211 is formed in a region corresponding to an element isolation portion 202 (FIG. 3) which surrounds the photoelectric conversion unit 102. However, they need not exactly correspond to each other. The second semiconductor region 211 need only be arranged in the region indicated by the broken lines so as to be able to raise the potential barrier between adjacent photoelectric conversion units 102. In the region of the photoelectric conversion unit 102 (the region surrounded by the inner broken line), a first semiconductor region 210 (to be described later) is arranged in the semiconductor substrate SB at a position deeper than the photoelectric conversion unit 102. The first semiconductor region 210 is a p-type semiconductor region. The thickness (first thickness) of the first semiconductor region 210 is smaller than the thickness (second thickness) of the second semiconductor region 211 so as to ensure saturated charges in the photoelectric conversion unit 102.

A gate 103a of the transfer transistor 103 is arranged between the photoelectric conversion unit 102 and the FD 119. The FD 119 temporarily holds a signal (charges) transferred from the photoelectric conversion unit 102 via the transfer transistor 103. FIG. 2 does not illustrate the amplification MOS transistor 104, reset MOS transistor 105, and selection MOS transistor 106.

Figure 3:
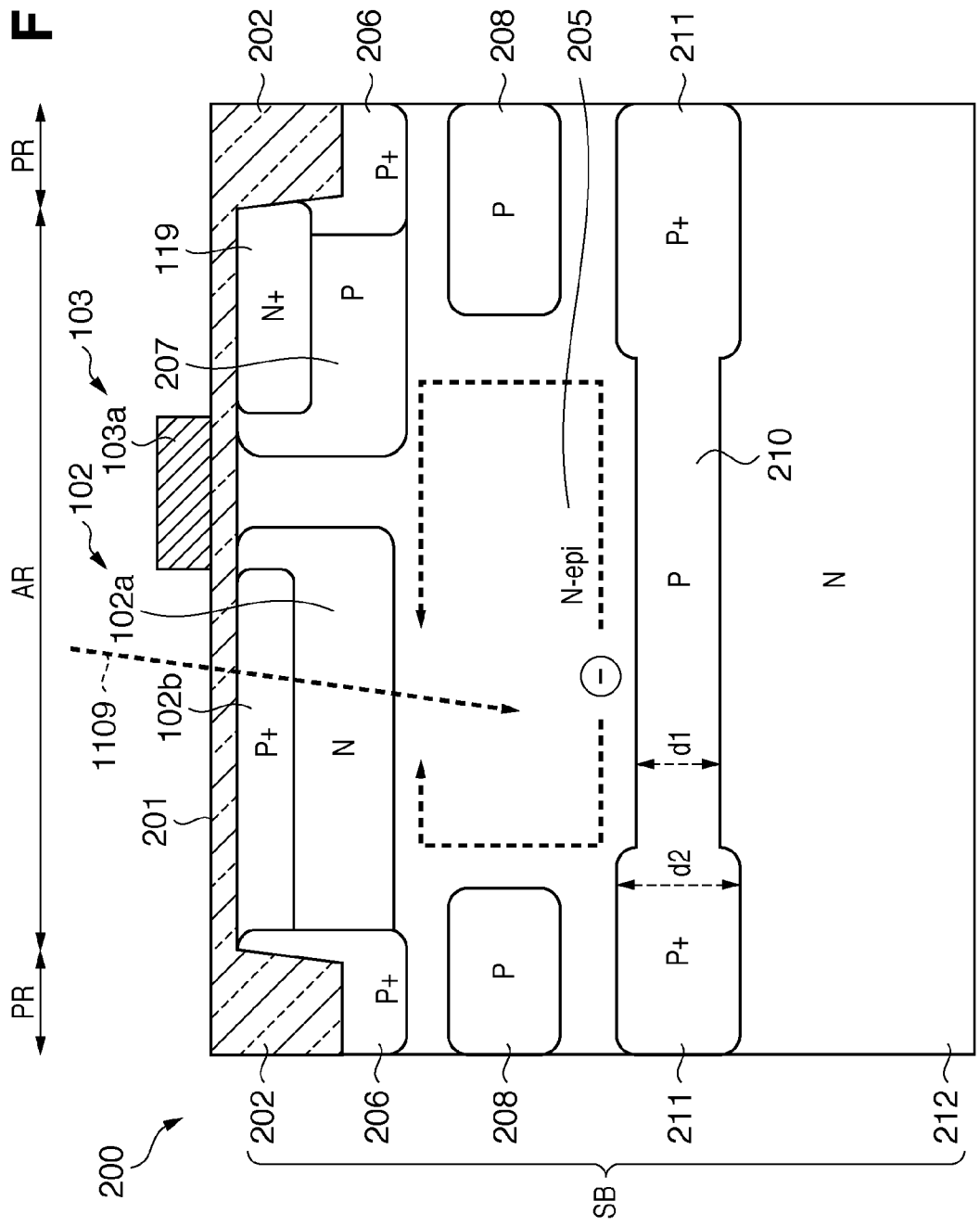
FIG. 3 is a sectional view taken along a line A-A in FIG. 2.

The sectional structure of the photoelectric conversion device 200 will be described next. FIG. 3 is a sectional view taken along a line A-A in FIG. 2. FIG. 3 does not illustrate the structure of the upper layer formed by the steps after contact plug formation. It should be noted that the control portion 10 has the similar sectional structure as the pixel array PA.

As shown in FIG. 3, the photoelectric conversion device 200 has the semiconductor substrate SB including an element region (first region) AR and an element isolation region (second region) PR. The semiconductor substrate SB includes the plurality of photoelectric conversion units 102, the first semiconductor region 210, the element isolation portion 202, a channel stop region 206, the second semiconductor region 211, a underlying region 212, and a semiconductor region 208.

Each photoelectric conversion unit 102 is arranged in the element region AR. The photoelectric conversion unit 102 includes a charge accumulation layer (third semiconductor region) 102a, semiconductor region 205, and protection layer 102b. The charge accumulation layer 102a is formed by, for example, epitaxial growth. The charge accumulation layer 102a is an n-type (first conductivity type) semiconductor region to accumulate a photoelectrically converted signal. The semiconductor region 205 is an n$^-$-type semiconductor region. "N$^-$-type" indicates that the concentration of an n-type impurity is lower than in an "n-type" region. The charge accumulation layer 102a and the semiconductor region 205 function as the cathode of the photoelectric conversion unit 102. The protection layer 102b is a p$^+$-type semiconductor region to protect the charge accumulation layer 102a. Note that the first semiconductor region 210, second semiconductor region 211, and semiconductor region 208 function as the anode region of the photoelectric conversion unit 102.

The potential in the charge accumulation layer 102a is lower than in the semiconductor region 205 for a signal (charges or electrons). The photoelectric conversion unit 102 accumulates a signal (charges or electrons) in the charge accumulation layer 102a during an accumulation period. The charge accumulation layer 102a is partially located under the gate 103a of the transfer MOS transistor 103. In this structure (structure suitable for complete charge transfer), when the transfer MOS transistor 103 is turned on, the signal (charges) is completely transferred from the charge accumulation layer 102a of the photoelectric conversion unit 102 to the FD 119. When the signal (charges) is efficiently transferred, the fluctuation in the signal amount (number of electrons) remaining in the charge accumulation layer 102a of the photoelectric conversion unit 102 becomes small. This allows implementing a photoelectric conversion device with small random noise. The charge accumulation layer 102a that is partially located under the gate 103a of the transfer MOS transistor 103 can be formed by forming the charge accumulation layer 102a by patterning and ion implantation before formation of the gate 103a of the transfer MOS transistor 103. Alternatively, the charge accumulation layer 102a that is partially located under the gate 103a of the transfer MOS transistor 103 can be formed by obliquely performing ion implantation after formation of the gate 103a of the transfer MOS transistor 103.

The first semiconductor region 210 is arranged in a first thickness d1 under the photoelectric conversion unit 102 in the element region AR. The first semiconductor region 210 is a p-type (second conductivity type) semiconductor region opposite to the conductivity type (n-type) of the charge accumulation layer 102a.

The element isolation portion 202 is arranged in the element isolation region PR. The element isolation portion 202 electrically isolates the plurality of photoelectric conversion units 102 from each other.

The channel stop region 206 is arranged under the element isolation portion 202. The channel stop region 206 is a p$^+$-type semiconductor region.

The second semiconductor region 211 is arranged in a second thickness d2 larger than the first thickness d1 under the element isolation portion 202 in the element isolation region PR. The second semiconductor region 211 is a p$^+$-type (second conductivity type) semiconductor region opposite to the conductivity type (n-type) of the charge accumulation layer 102a. To ensure a potential barrier in the lateral direction, the impurity concentration in the second semiconductor region 211 is made higher than that in the first semiconductor region 210.

The lateral position of the boundary between the first semiconductor region 210 and the second semiconductor region 211 is determined in consideration of the opening area of the photoelectric conversion unit 102 and the position at which incident light arrives.

The underlying region 212 is arranged under the first semiconductor region 210 and the second semiconductor region 211. The underlying region 212 contains an n-type impurity.

The semiconductor region 208 is arranged between the channel stop region 206 and the second semiconductor region 211.

As shown in FIG. 3, the semiconductor region 208 and the second semiconductor region 211 need not completely contact with each other if these p-type semiconductor regions can form a sufficient potential barrier against the charge accumulation layer 102a of the photoelectric conversion unit 102. The semiconductor region 208 may have a plurality of profiles. A semiconductor region 207 may also serve as a potential barrier. Even when the semiconductor region 208 has a continuous profile in the impurity concentration, a desired characteristic can be obtained without any problem.

As described above, the p-type semiconductor region surrounds the semiconductor region 205 and the charge accumulation layer 102a. This structure raises the potential barrier between adjacent photoelectric conversion units 102. It is therefore possible to a signal (charges) generated by a photoelectric conversion unit 102 from leaking to an adjacent photoelectric conversion unit 102. That is, the photoelectric conversion unit 102 can reliably accumulate the generated signal (charges). The semiconductor region 207 which is formed to cover the FD 119 prevents the FD 119 from absorbing the signal (charges) generated by incident light. The characteristic of the transfer MOS transistor 103 can be determined to ensure the breakdown voltage between the FD 119 and the charge accumulation layer 102a by the semiconductor region 207. The semiconductor region 207 is also arranged under other transistors in the pixel, although not illustrated. Hence, the semiconductor region 207 can also function as the well of these transistors.

Figure 4:
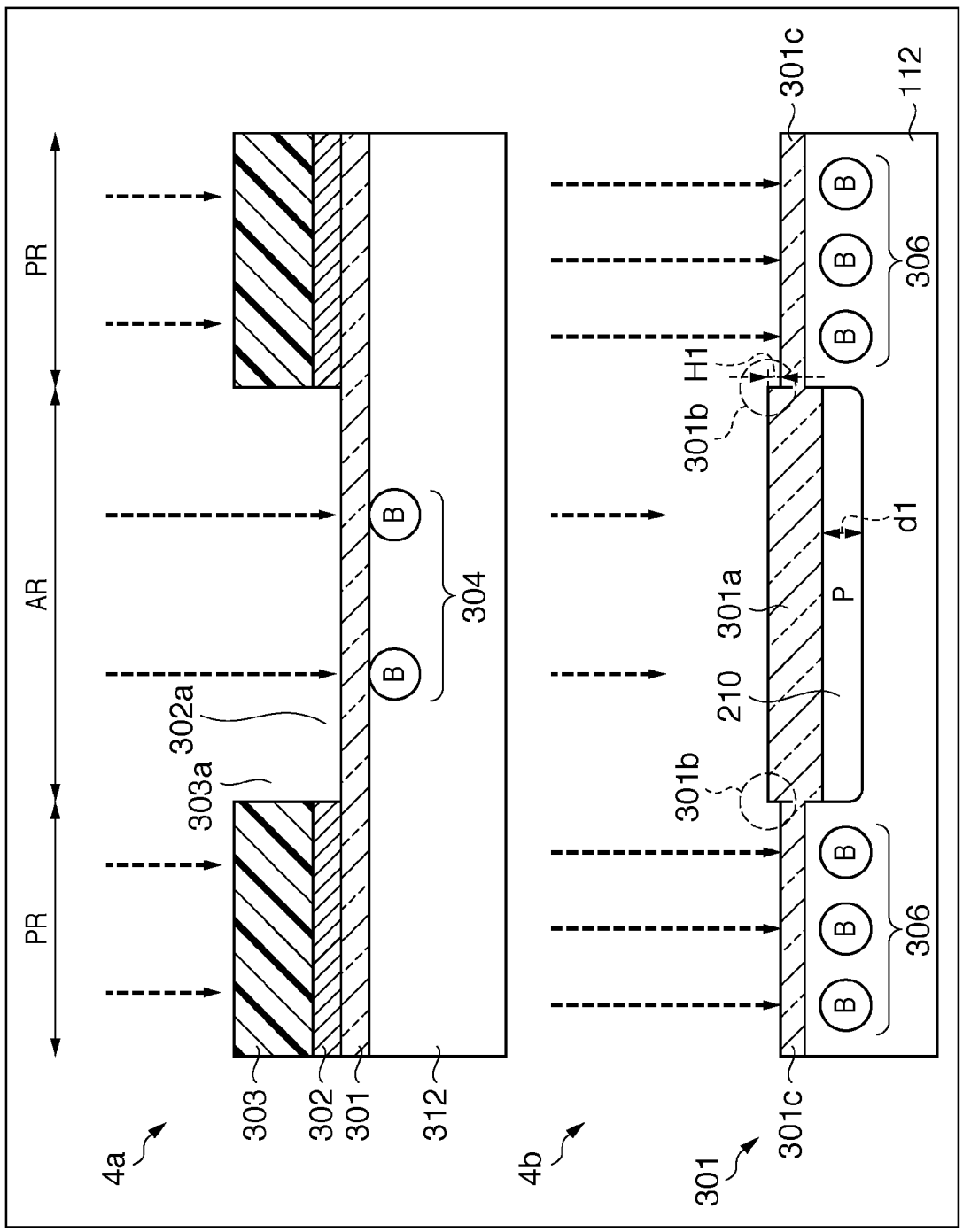
FIG. 4 is a sectional view showing steps in the method of manufacturing the photoelectric conversion device 200.
Figure 5:
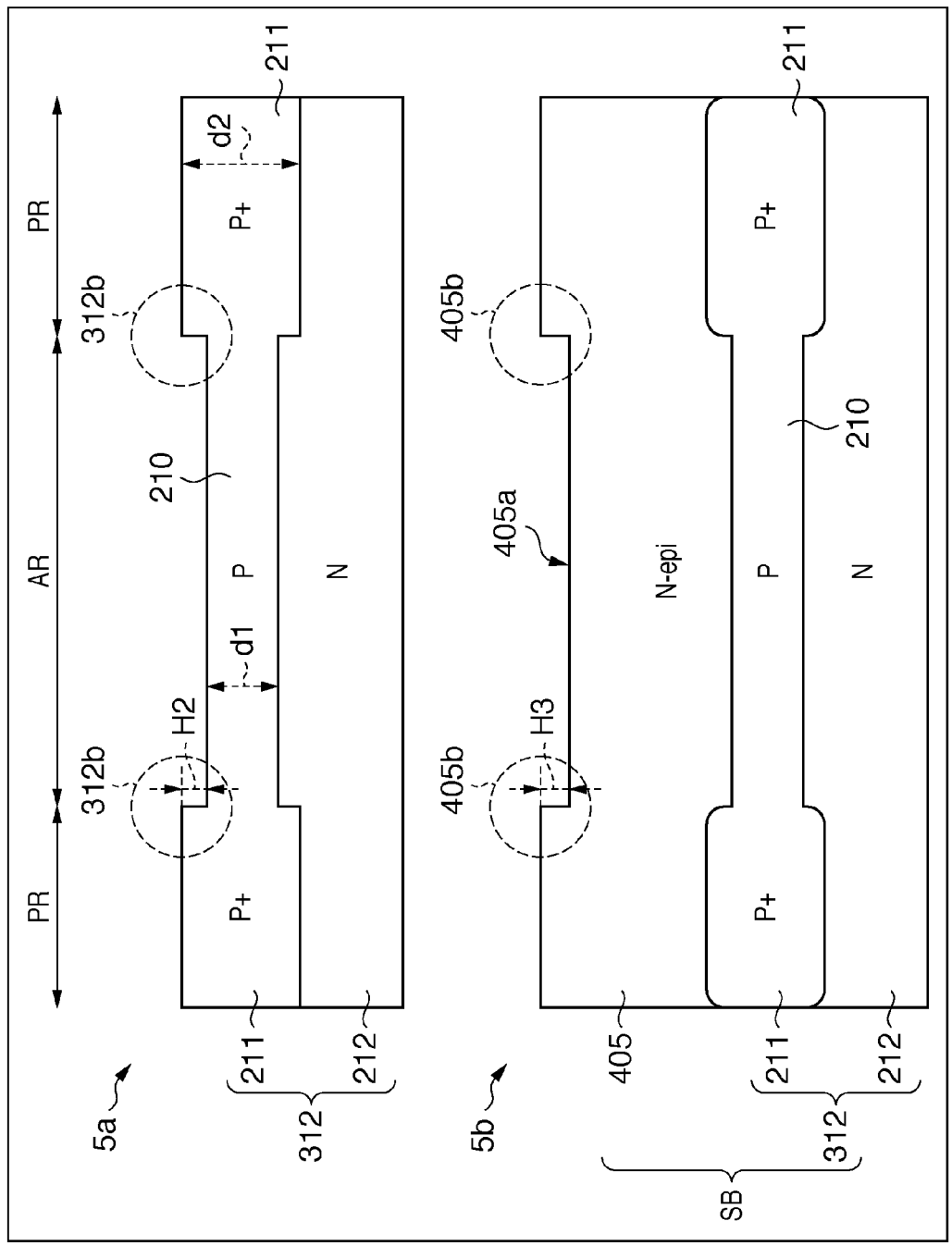
FIG. 5 is a sectional view showing steps in the method of manufacturing the photoelectric conversion device 200.

A method of manufacturing the photoelectric conversion device 200 to implement the sectional structure shown in FIG. 3 will be described next with reference to FIGS. 4 and 5. FIGS. 4 and 5 are sectional views showing steps in the method of manufacturing the photoelectric conversion device 200.

An underlying substrate 312 is prepared first, as indicated by 4a in FIG. 4. The underlying substrate 312 includes the element region AR and the element isolation region PR. The underlying substrate 312 contains an n-type impurity.

The underlying substrate 312 is thermally oxidized to form a silicon oxide film 301 on the surface of the underlying substrate 312 (oxide film formation step).

A silicon nitride film is formed on the silicon oxide film 301 by thermal CVD (nitride film formation step in the mask formation step).

A resist is applied to the silicon nitride film. The resist in the element region AR is selectively removed by photolithography. With this process, a resist mask 303 having a first opening 303a is formed on the silicon nitride film in the element region AR (resist mask formation step in the mask formation step).

The silicon nitride film in the region exposed by the first opening 303a is etched by dry etching, thereby forming a nitride film mask 302 having a second opening 302a in the element region AR (etching step in the mask formation step). At this time, the silicon oxide film 301 is rarely etched because the dry etching conditions are set to ensure a high selectivity with respect to the silicon oxide film.

The silicon oxide film 301 after etching preferably has a thickness of about 5 to 100 nm because it need only prevent channeling in the succeeding ion implantation step and have a thickness with a sufficient margin with respect to the implantation energy.

P-type impurity ions are implanted into the underlying substrate 312 via the silicon oxide film 301 in the region exposed by the first opening 303a and the second opening 302a. The p-type impurity ions are, for example, boron ions.

With this process, impurity ions 304 are implanted into the underlying substrate 312 at a portion under the silicon oxide film 301 in the element region AR (first implantation step). The structure is heated to stabilize the impurity ions 304 so that the first semiconductor region 210 having the first thickness d1 is formed in the underlying substrate 312 under the silicon oxide film 301 in the element region AR, as indicated by 4b in FIG. 4 (first implantation step).

The resist mask 303 is removed, and cleaning is performed. The silicon oxide film 301 in the region exposed by the second opening 302a is oxidized to thicken the exposed region (oxidation step). A portion 301a thickened in the oxidation step has a thickness of, for example, about 100 to 300 nm. Oxidation does not progress in the region where the nitride film mask 302 remains. For this reason, the surface of the silicon oxide film 301 including the portion 301a thickened in the oxidation step has a step 301b at which the element region AR projects with respect to the element isolation region PR.

For example, the portion 301a thickened in the oxidation step and a portion 301c unthickened in the oxidation step have a thickness difference of 100 nm or more. In this case, a height H1 of the step 301b is 50 nm or more.

The nitride film mask 302 is removed to expose the silicon oxide film 301 in the region that is not exposed by the second opening 302a (the portion 301c unthickened in the oxidation step) (exposure step).

After the exposure step, p-type impurity ions are implanted into the underlying substrate 312 via the portion 301c unthickened in the oxidation step. With this process, impurity ions 306 are implanted into the underlying substrate 312 under the silicon oxide film 301 in the element isolation region PR (second implantation step).

The structure is heated to stabilize the impurity ions 306 so that the second semiconductor region 211 having the second thickness d2 is formed in the underlying substrate 312 under the silicon oxide film 301 in the element isolation region PR (second implantation step). The second thickness d2 is larger than the first thickness d1.

After the second implantation step, the silicon oxide film 301 including the portion 301a thickened in the oxidation step is removed (removal step). The portion 301a thickened in the oxidation step and the portion 301c unthickened in the oxidation step have different thicknesses. For this reason, the surface of the underlying substrate 312 has a step 312b at which the element region AR sinks with respect to the element isolation region PR, as indicated by 5a in FIG. 5.

Assume that the portion 301a thickened in the oxidation step and the portion 301c unthickened in the oxidation step have a thickness difference of 100 nm or more in the removed silicon oxide film 301. In this case, a height H2 of the step 312b is 50 nm or more.

After the removal step, a semiconductor layer 405 is epitaxially grown on the underlying substrate 312, as indicated by 5b in FIG. 5. With this process, the semiconductor substrate SB including the underlying substrate 312 and the semiconductor layer 405 is formed (growing step). Since the surface of the underlying substrate 312 has the step 312b at which the element region AR sinks with respect to the element isolation region PR, the surface of the semiconductor layer 405 also has a step 405b at which the element region AR sinks with respect to the element isolation region PR. The step 405b is usable for exposure position alignment after the epitaxial growth.

Assume that the height H2 of the step 312b is 50 nm or more. In this case, a height H3 of the step 405b is also 50 nm or more.

Next, the charge accumulation layer 102a is formed above the first semiconductor region 210. More specifically, the charge accumulation layer 102a is formed between the first semiconductor region 210 and a surface 405a of the semiconductor layer 405 in the semiconductor substrate SB (element formation step).

A description of the step of forming the semiconductor region 208, semiconductor region 207, protection layer 102b, channel stop region 206, element isolation portion 202, and the gate 103a of the transfer MOS transistor 103 and the steps after contact plug formation will be omitted.

In this embodiment, the conductivity type of the epitaxially grown semiconductor layer is $n^-$-type. However, the present invention is also applicable even when the conductivity type of the epitaxially grown semiconductor layer is $p^-$ type. Alternatively, this embodiment is also modified such that conductivity types of all the semiconductor regions are inversed.

As described above, according to this embodiment, it is possible to form the first semiconductor region 210 that most influences the pixel sensitivity in principle and the second semiconductor region 211 adjacent to the first semiconductor region 210 at the same depth in a self-aligned manner. Additionally, the semiconductor region can be formed at a position deeper than the critical energy of the conventional high-energy implantation apparatus. This allows large improvement of the sensitivity of the photoelectric conversion device. It is also possible to decrease color mixture by reducing leakage to neighboring pixels. Furthermore, since the semiconductor region for suppressing charge leakage to the substrate can be formed at a deeper position, it is possible to form the photoelectric conversion unit 102 whose semiconductor region for accumulating charges has a larger volume per unit area than in the related art. That is, saturated charges in the photoelectric conversion element can also be increased.

As described above, even when the interval between the photoelectric conversion units is smaller, a sufficient potential barrier can be formed between the charge accumulation layers of adjacent photoelectric conversion units. This allows improving the sensitivity of the photoelectric conversion units. Additionally, since the charge accumulation layers of adjacent photoelectric conversion units are prevented from capacitively coupling with each other, crosstalk between the adjacent photoelectric conversion units can be suppressed. That is, it is possible to improve the sensitivity of photoelectric conversion units and suppress crosstalk between adjacent photoelectric conversion units even when the interval between them is smaller.

Instead of performing ion implantation using a high-energy implantation apparatus, an arbitrary ion implantation amount is obtained using a medium- or high-current implantation apparatus, and resist patterning of each diffusion layer (i.e. semiconductor layer) is performed at a low ion implantation energy. For this reason, a low-damage semiconductor region can easily be formed by micropatterning. That is, it is possible to raise the accuracy in forming semiconductor regions having different thicknesses in a semiconductor substrate.

This embodiment may also achieve at least one of the following effects.

A semiconductor region can easily accurately be formed at a deep position from the light-receiving surface at which the photoelectric conversion unit receives light. A silicon step formed upon forming the semiconductor region can easily provide an alignment step necessary for subsequent steps to the silicon surface after epitaxial growth.

Leakage to neighboring pixels at the deepest position is small. Even when the photoelectric conversion unit 102 is saturated, the saturated charges are discharged to an N-type substrate via a p-type semiconductor region arranged at a deep position. Hence, the smear characteristic also improves.

Since the p-type semiconductor region has a lattice shape, the total resistance value of the charge accumulation layers 102a decreases, and the GND potential stabilizes. It is therefore possible to obtain an image with less shading even in a high-speed reading operation.

Figure 6:
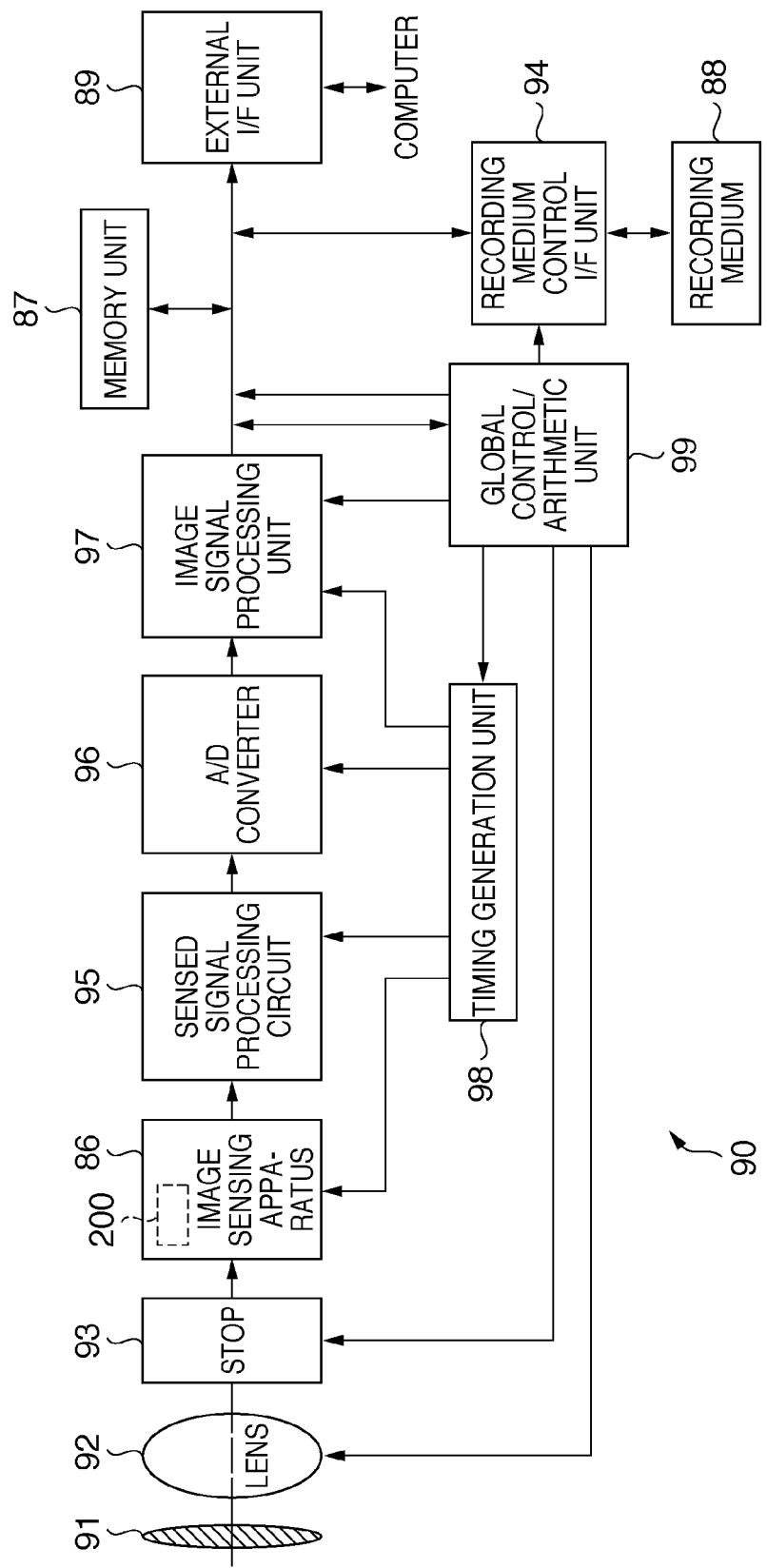
FIG. 6 is a block diagram showing the arrangement of an image sensing system using the photoelectric conversion device according to the first embodiment.

FIG. 6 shows an example of an image sensing system to which the photoelectric conversion device of the present invention is applied.

As shown in FIG. 6, an image sensing system 90 mainly includes an optical system, image sensing apparatus 86, and signal processing unit. The optical system mainly includes a shutter 91, lens 92, and stop 93. The image sensing apparatus 86 includes the photoelectric conversion device 200. The signal processing unit mainly includes an sensed signal processing circuit 95, A/D converter 96, image signal processing unit 97, memory unit 87, external I/F unit 89, timing generation unit 98, global control/arithmetic unit 99, recording medium 88, and recording medium control I/F unit 94. The signal processing unit need not always include the recording medium 88.

The shutter 91 is located in front of the lens 92 on the optical path to control exposure.

The lens 92 refracts incident light and forms an object image on the imaging plane of the photoelectric conversion device 200 of the image sensing apparatus 86.

The stop 93 is provided on the optical path between the lens 92 and the photoelectric conversion device 200 to adjust the amount of light which passes through the lens 92 and is guided to the photoelectric conversion device 200.

The photoelectric conversion device 200 of the image sensing apparatus 86 converts the object image formed on the imaging plane of the photoelectric conversion device 200 into an image signal. The image sensing apparatus 86 reads out the image signal from the photoelectric conversion device 200 and outputs it.

The sensed signal processing circuit 95 is connected to the image sensing apparatus 86 to process the image signal output from the image sensing apparatus 86.

The A/D converter 96 is connected to the sensed signal processing circuit 95 to convert the processed image signal (analog signal) output from the sensed signal processing circuit 95 into an image signal (digital signal).

The image signal processing unit 97 is connected to the A/D converter 96 to execute arithmetic processes such as various kinds of correction for the image signal (digital signal) output from the A/D converter 96, thereby generating image data. The image data is supplied to the memory unit 87, external I/F unit 89, global control/arithmetic unit 99, and recording medium control I/F unit 94.

The memory unit 87 is connected to the image signal processing unit 97 to store the image data output from the image signal processing unit 97.

The external I/F unit 89 is connected to the image signal processing unit 97 so that the image data output from the image signal processing unit 97 is transferred to an external device (e.g., personal computer) via the external I/F unit 89.

The timing generation unit 98 is connected to the image sensing apparatus 86, sensed signal processing circuit 95, A/D converter 96, and image signal processing unit 97 to supply a timing signal to them. The image sensing apparatus 86, sensed signal processing circuit 95, A/D converter 96, and image signal processing unit 97 operate in synchronism with the timing signal.

The global control/arithmetic unit 99 is connected to the timing generation unit 98, image signal processing unit 97, and recording medium control I/F unit 94 to comprehensively control them.

The recording medium 88 is detachably connected to the recording medium control I/F unit 94. The image data output from the image signal processing unit 97 is recorded on the recording medium 88 via the recording medium control I/F unit 94.

In the above-described arrangement, when a satisfactory image signal is obtained by the photoelectric conversion device 200, a satisfactory image (image data) can be obtained.

Figure 7:
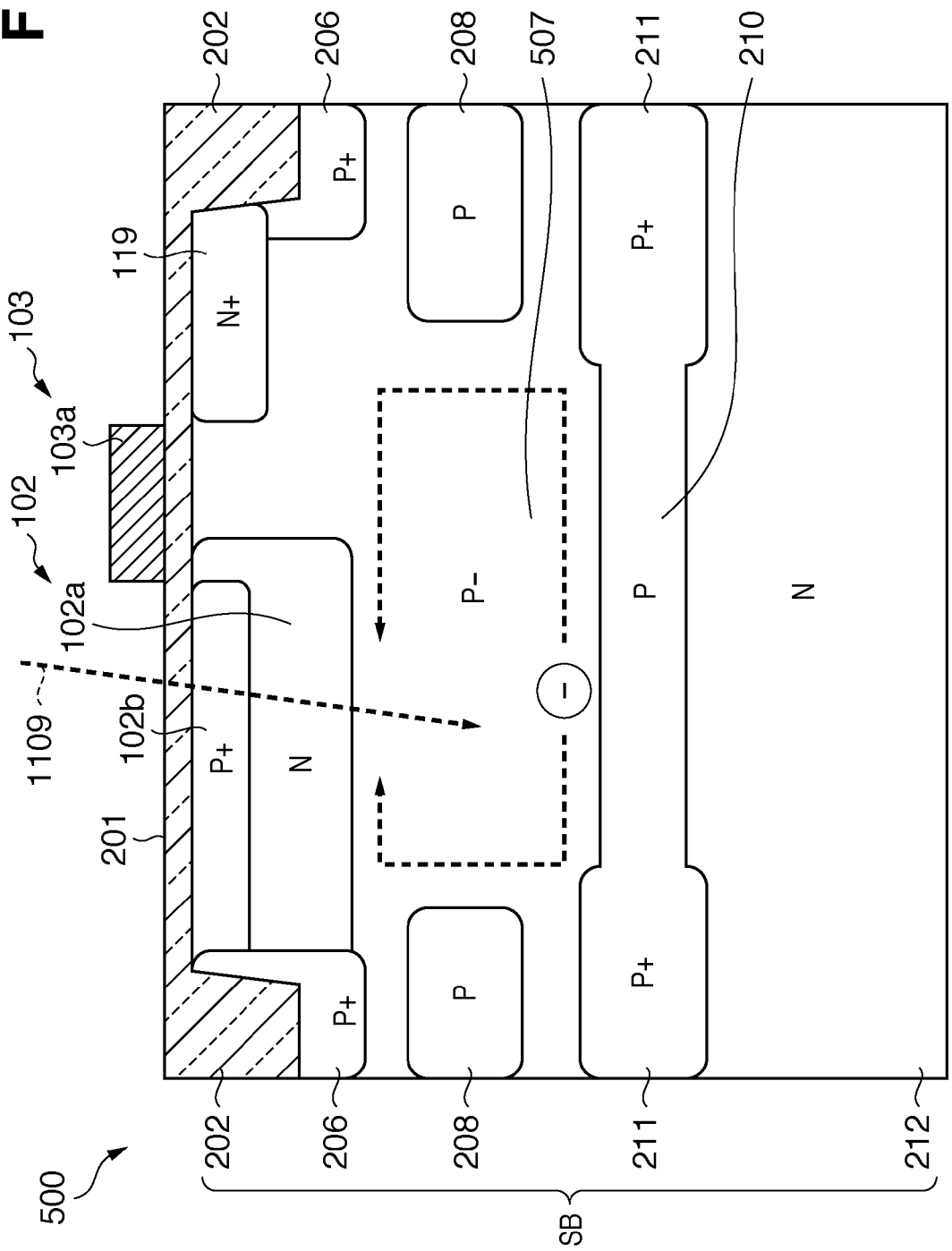
FIG. 7 is a sectional view showing the structure of a photoelectric conversion device 500 according to the second embodiment of the present invention.

A photoelectric conversion device 500 according to the second embodiment of the present invention will be described next with reference to FIG. 7. FIG. 7 is a sectional view showing the structure of the photoelectric conversion device 500 according to the second embodiment of the present invention.

The photoelectric conversion device 500 includes a semiconductor layer 507. The semiconductor layer 507 contains a p⁻-type impurity. Since ion implantation is performed all over the pixel in forming the p-type semiconductor region, the required processing accuracy can be reduced. The depletion voltage of a charge accumulation layer 102a can be adjusted by adjusting the impurity profile in the p-type semiconductor region is adjusted. Simultaneously, the variation in the transfer characteristic can also be reduced. Hence, this embodiment can exhibit an effect by a photoelectric conversion device including a lot of pixels and having a large chip area.

Figure 8:
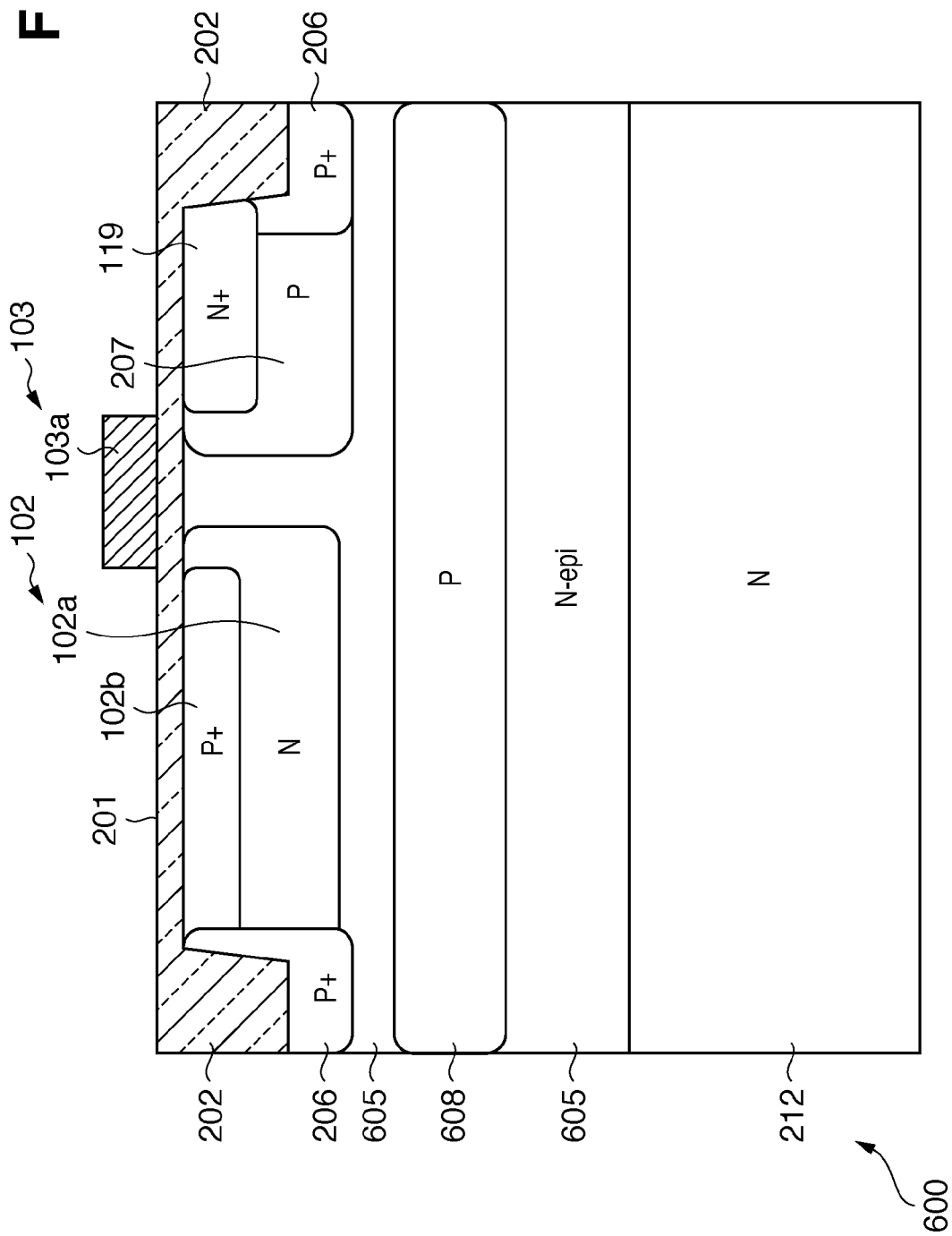
FIG. 8 is a sectional view showing the structure of a photoelectric conversion device 600 according to the third embodiment of the present invention.

A photoelectric conversion device 600 according to the third embodiment of the present invention will be described next with reference to FIG. 8. FIG. 8 is a sectional view showing the structure of the photoelectric conversion device 600 according to the third embodiment of the present invention.

A pixel array PA of the photoelectric conversion device 600 has an effective pixel region and an optical black region. The arrangement of a pixel included in the optical black region is different from that of the first embodiment.

As shown in FIG. 8, a pixel (to be referred to as an OB pixel hereinafter) included in the optical black region includes neither a first semiconductor region 210 nor a second semiconductor region 211 (see FIG. 3). That is, the method of manufacturing the photoelectric conversion device 600 is different from that of the first embodiment in the following points.

In the steps indicated by 4a and 4b in FIG. 4, no opening is formed in the resist and the silicon nitride film to inhibit implantation of a p-type impurity ions 304 only for the OB pixel. Alternatively, resist patterning and ion implantation are performed using a mask which has a layout to cover the OB pixel portion. This enables to obtain a structure without the first semiconductor region 210 and the second semiconductor region 211 only in the OB pixel.

However, without the first semiconductor region 210, the noise component from the substrate may mix into mainly the hole charge accumulation layer. To prevent this, in the step indicated by 5b in FIG. 5, after a semiconductor layer 605 is epitaxially grown, p-type impurity ions are implanted via the overall surface of the optical black region into the semiconductor layer 605, thereby forming a semiconductor region 608 in the semiconductor layer 605.

According to this embodiment, it is possible to suppress an optical carrier generated by a long wavelength and, more particularly, a far infrared wavelength from mixing into the OB pixel and avoid any increase in the black level of the OB pixel. That is, the characteristic of the OB pixel can be improved.

The arrangement of a pixel included in the effective pixel region is the same as in the first embodiment.

Figure 9:
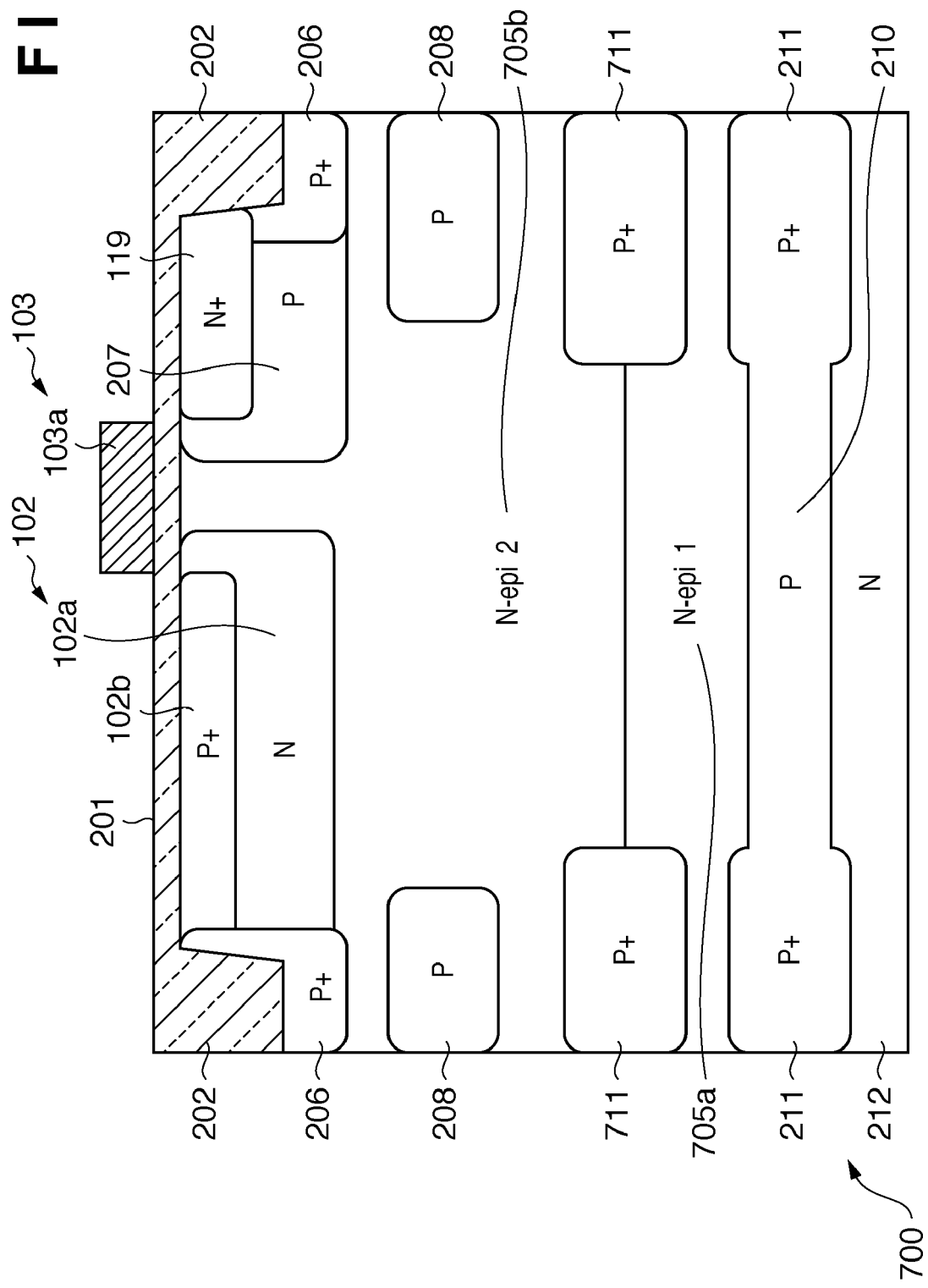
FIG. 9 is a sectional view showing the structure of a photoelectric conversion device 700 according to the fourth embodiment of the present invention.

A photoelectric conversion device 700 according to the fourth embodiment of the present invention will be described next with reference to FIG. 9. FIG. 9 is a sectional view showing the structure of the photoelectric conversion device 700 according to the fourth embodiment of the present invention.

In the step indicated by 5b in FIG. 5, a semiconductor layer 405 is epitaxially grown at 1,000° C. or more. Hence, an n-type impurity may diffuse from the semiconductor layer 405 to a first semiconductor region 210 in the growing process of the semiconductor layer 405.

In this embodiment, the photoelectric conversion device 700 includes semiconductor layers 705a and 705b and a semiconductor region 711. The semiconductor layer 705a is arranged between the first semiconductor region 210 and the semiconductor layer 705b. The semiconductor region 711 is arranged between a semiconductor region 208 and a second semiconductor region 211. The semiconductor layer 705a is an n⁻-type semiconductor region. The semiconductor layer 705b is an n-type semiconductor region. That is, the n-type impurity concentration in the semiconductor layer 705a is lower than that in a semiconductor region 205 (see FIG. 3). For this reason, the n-type impurity hardly diffuses from the semiconductor layer 705a to the first semiconductor region 210. As described above, when the thicknesses of the semiconductor layers 705a and 705b are appropriately controlled, impurity diffusion from the semiconductor layer 705a to the first semiconductor region 210 can be reduced while ensuring the saturated charge amount in the semiconductor layer 705b. It is therefore possible to increase the sensitivity of the pixel.

Figure 10:
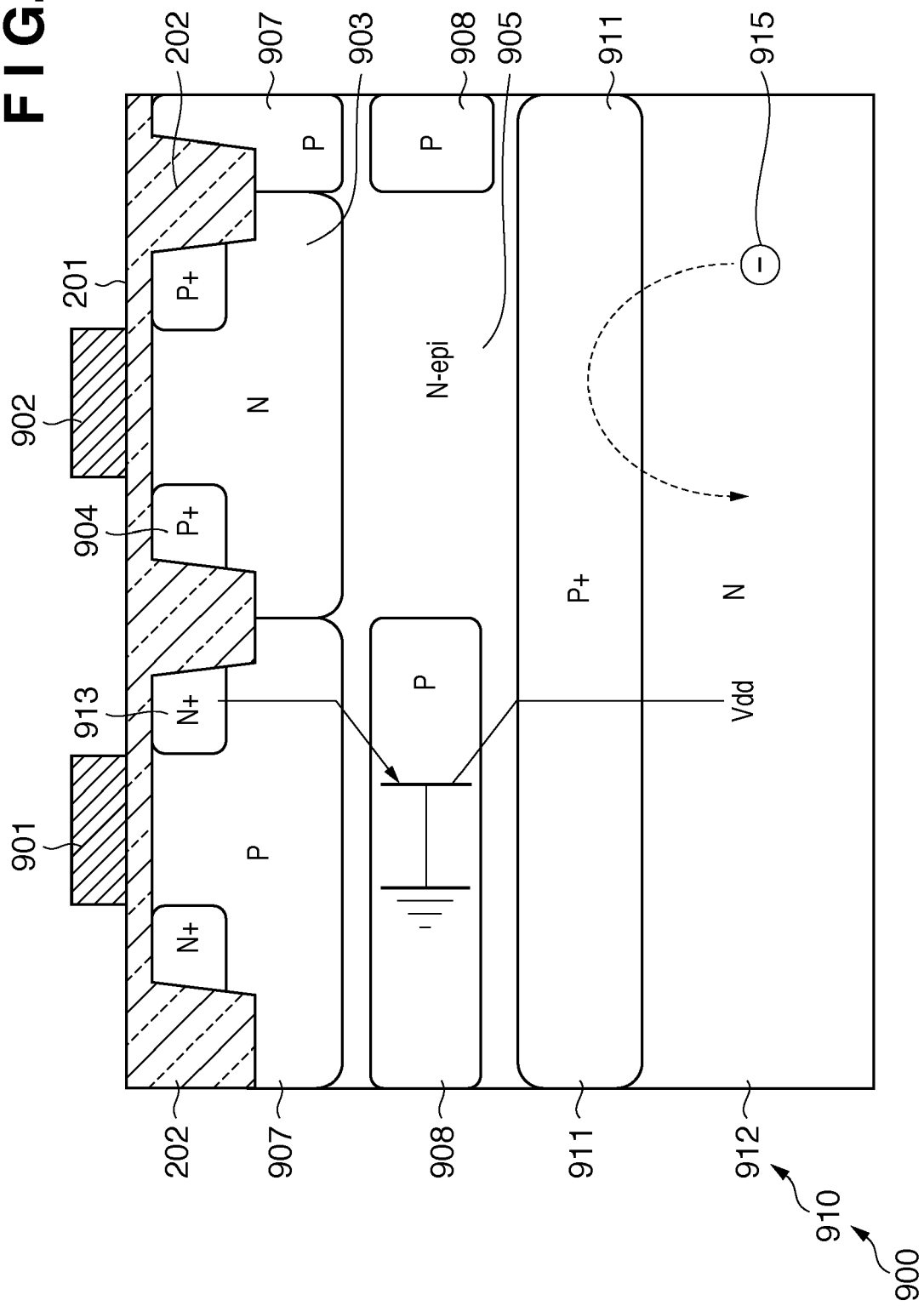
FIG. 10 is a sectional view showing the structure of a photoelectric conversion device 900 according to the fifth embodiment of the present invention.
Figure 11:
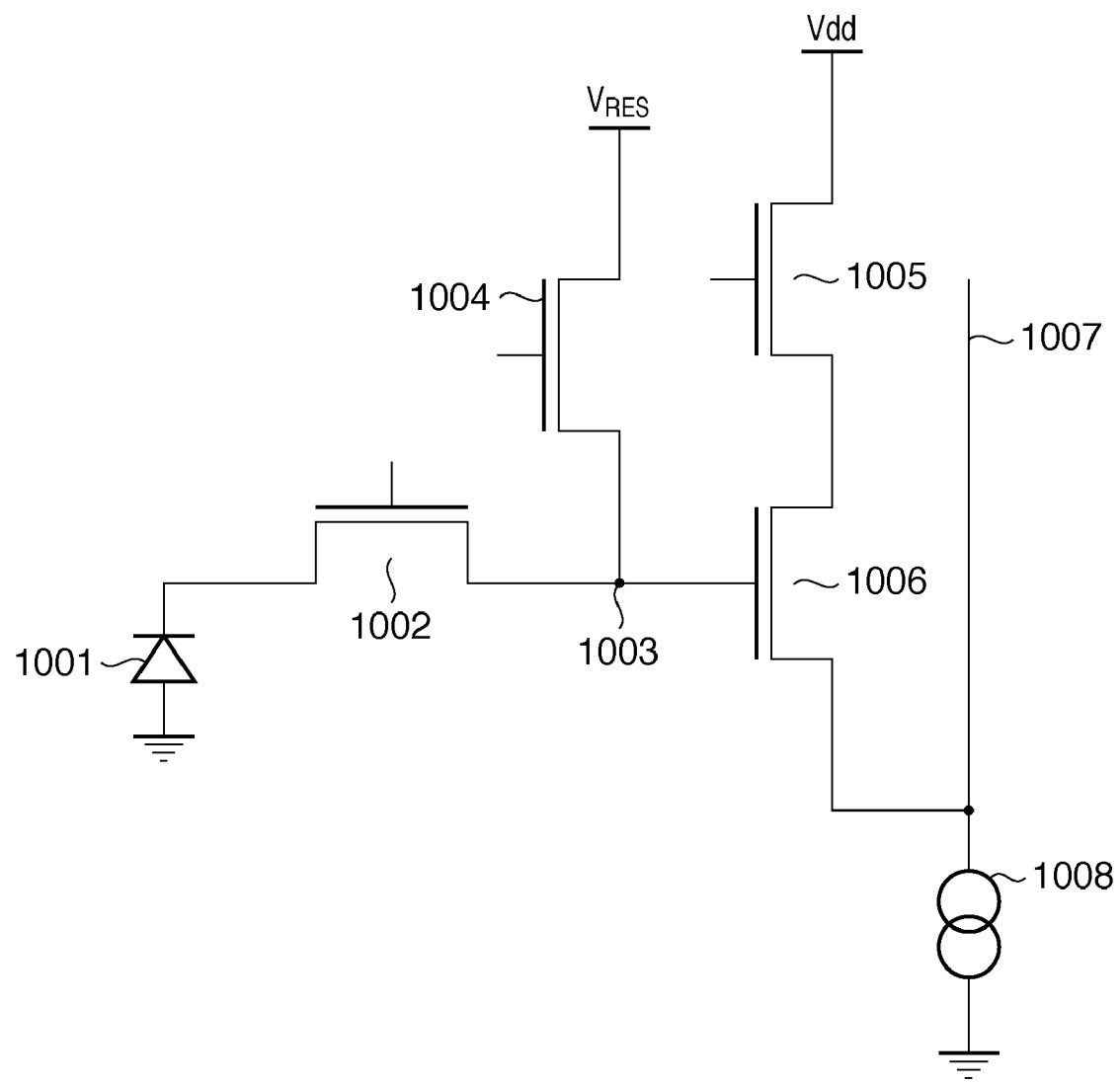
FIG. 11 is a circuit diagram of a pixel of a conventional CMOS sensor.
Figure 12:
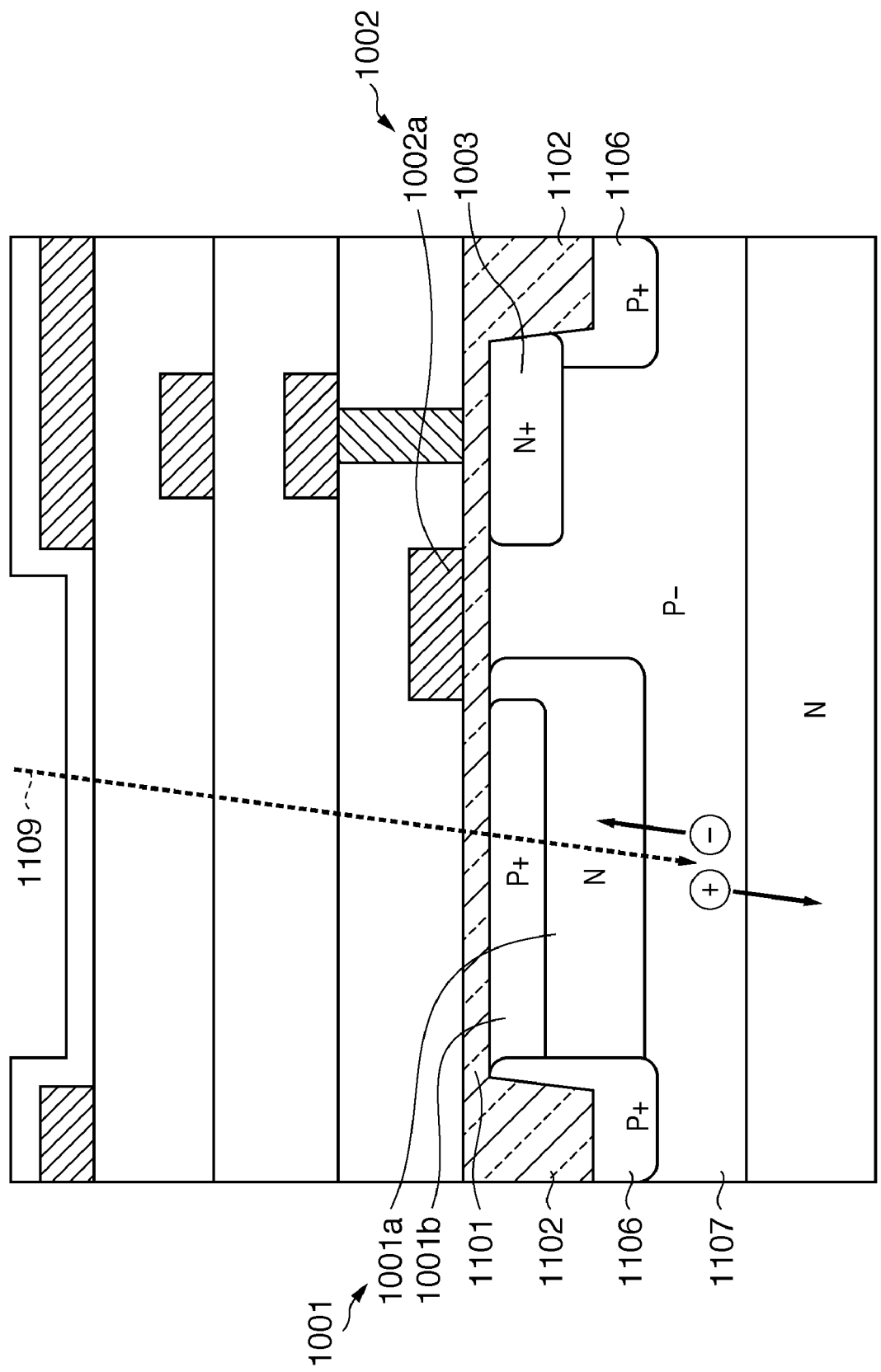
FIG. 12 is a sectional view of a pixel of a conventional CMOS sensor.

A photoelectric conversion device 900 according to the fifth embodiment of the present invention will be described next with reference to FIG. 10. FIG. 10 is a sectional view showing the structure of the photoelectric conversion device 900 according to the fifth embodiment of the present invention.

In a pixel array PA of the photoelectric conversion device 900, the arrangement of a control portion 910 is different from the first embodiment.

As shown in FIG. 10, the control portion 910 includes neither a first semiconductor region 210 nor a second semiconductor region 211 (see FIG. 3). In the control portion 910, a p-type buried diffusion layer 908 and a p-type buried isolation layer 911 are arranged under a p-type well 907 on which an NMOS transistor including a gate 901 and a source (or drain) 913 is formed. This allows reducing the base resistance of a parasitic bipolar structure formed by an n-type underlying region 912 and the p-type well 907 and improve the latch-up resistance.

Additionally, the p-type buried isolation layer 911 is arranged under an n-type well 903 on which a PMOS transistor including a gate 902 and a source (or drain) 904 is formed. The p-type well 907 and the p-type diffusion isolation layer 908 are arranged beside the n-type well 903. This allows setting the potential of the n-type well 903 in a floating state and shield noise 915 generated from another circuit and mixed via the underlying region 912.

According to this embodiment, it is possible to improve the latch-up resistance of the control portion while improving the sensitivity of the photoelectric conversion unit, and reduce the noise component generated by the substrate current.

The effects can also be obtained by combining each of the above-described third to fifth embodiments with the first and second embodiments. Alternatively, this embodiment is also modified such that conductivity types of all the semiconductor regions are inversed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-341113, filed Dec. 28, 2007, which is hereby incorporated by reference herein in its entirety.

What is claimed is:

1. A photoelectric conversion device manufacturing method comprising:
    an oxide film formation step of forming an oxide film on a surface of an underlying substrate including an element region and an element isolation region;
    a mask formation step of forming, on the oxide film, a mask having an opening in the element region;
    a first implantation step of implanting impurity ions of a first conductivity type into the underlying substrate via a region of the oxide film exposed by the opening, thereby forming a first semiconductor region having a first thickness in the underlying substrate under the oxide film in the element region;
    an oxidation step of oxidizing the region of the oxide film exposed by the opening, thereby thickening the exposed region;
    an exposure step of exposing a region of the oxide film which is not exposed by the opening;
    a second implantation step of, after the exposure step, implanting the impurity ions of the first conductivity type into the underlying substrate via a region unthickened in the oxidation step, thereby forming a second semiconductor region having a second thickness larger than the first thickness in the underlying substrate under the oxide film in the element isolation region; and
    an element formation step of, after the second implantation step, forming a photoelectric conversion unit above the first semiconductor region, the photoelectric conversion unit including a third semiconductor region of a second conductivity type opposite to the first conductivity type and accumulating a photoelectrically converted signal.

2. The method according to claim 1, wherein the mask formation step comprises:
    a nitride film formation step of forming a nitride film on the oxide film;
    a resist mask formation step of forming, on the nitride film, a resist mask having a first opening in the element region; and
    an etching step of etching a region of the nitride film exposed by the first opening, thereby forming a nitride film mask having a second opening in the element region,
    and wherein, in the first implantation step, the impurity ions are implanted into the underlying substrate via a region exposed by the first opening and the second opening, and
    in the oxidation step, the resist mask is removed, and a region of the oxide film exposed by the second opening is oxidized.

3. The method according to claim 1, wherein a surface of the oxide film including a portion thickened in the oxidation step has a step at which the element region projects with respect to the element isolation region.

4. The method according to claim 1, further comprising:
a removal step of, after the second implantation step, removing the oxide film including the portion thickened in the oxidation step; and
a growing step of, after the removal step, growing a semiconductor layer on the underlying substrate, thereby forming a semiconductor substrate including the underlying substrate and the semiconductor layer,
wherein, in the element formation step, the third semiconductor region is formed between the first semiconductor region and a surface of the semiconductor layer in the semiconductor substrate, and
the surface of the semiconductor layer has a step at which the element region sinks with respect to the element isolation region.

5. A semiconductor device manufacturing method comprising:
an oxide film formation step of forming an oxide film on a surface of an underlying substrate including a first region and a second region;
a mask formation step of forming, on the oxide film, a mask having an opening in the first region;
a first implantation step of implanting impurity ions into the underlying substrate via a region of the oxide film exposed by the opening, thereby forming a first semiconductor region having a first thickness in the underlying substrate under the oxide film in the first region;
an oxidation step of oxidizing the region of the oxide film exposed by the opening, thereby thickening the exposed region;
an exposure step of exposing a region of the oxide film which is not exposed by the opening;
a second implantation step of, after the exposure step, implanting impurity ions into the underlying substrate via a region unthickened in the oxidation step, thereby forming a second semiconductor region having a second thickness larger than the first thickness in the underlying substrate under the oxide film in the second region;
a removal step of, after the second implantation step, removing the oxide film including a portion thickened in the oxidation step; and
a growing step of, after the removal step, growing a semiconductor layer on the underlying substrate, thereby forming a semiconductor substrate including the underlying substrate and the semiconductor layer.

6. The method according to claim 5, wherein the mask formation step comprises:
a nitride film formation step of forming a nitride film on the oxide film;
a resist mask formation step of forming, on the nitride film, a resist mask having a first opening in the first region; and
an etching step of etching a region of the nitride film exposed by the first opening, thereby forming a nitride film mask having a second opening in the first region,
and wherein, in the first implantation step, the impurity ions are implanted into a region exposed by the first opening and the second opening, and
in the oxidation step, the resist mask is removed, and a region of the oxide film exposed by the second opening is oxidized.

7. A photoelectric conversion device comprising a semiconductor substrate having an element region and an element isolation region, wherein
the semiconductor substrate includes:
a plurality of photoelectric conversion units, each of the plurality of the photoelectric conversion units being arranged in the element region and including a semiconductor region of a first conductivity type to accumulate a photoelectrically converted signal;
a first semiconductor region of a second conductivity type opposite to the first conductivity type, the first semiconductor region having a first thickness and being arranged under the photoelectric conversion unit in the element region;
an element isolation portion being arranged in the element isolation region to electrically isolate the plurality of the photoelectric conversion units; and
a second semiconductor region of the second conductivity type, the second semiconductor region having a second thickness larger than the first thickness and being arranged under the element isolation portion in the element isolation region.

8. An image sensing system comprising:
a photoelectric conversion device according to claim 7;
an optical system which forms an image on an imaging plane of the photoelectric conversion device; and
a signal processing unit which processes a signal output from the photoelectric conversion device to generate image data.

* * * * *